United States Patent
Parekh et al.

(10) Patent No.: US 7,793,200 B1
(45) Date of Patent: Sep. 7, 2010

(54) METHOD OF AND CIRCUIT FOR ACCESSING A MEMORY OF A TRELLIS DECODER

(75) Inventors: Hemang Maheshkumar Parekh, San Jose, CA (US); Elizabeth R. Cowie, Edinburgh (GB); Jeffrey Allan Graham, Sydney (AU); Hai-Jo Tarn, San Jose, CA (US); Vanessa Yi-Mei Chou, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1015 days.

(21) Appl. No.: 11/527,830

(22) Filed: Sep. 27, 2006

(51) Int. Cl.
*H03M 13/03* (2006.01)
(52) U.S. Cl. ..................................... 714/792
(58) Field of Classification Search .................. 714/792, 714/795; 375/261, 262, 341
See application file for complete search history.

(56) References Cited

U.S. PATENT DOCUMENTS

| | | | |
|---|---|---|---|
| 5,844,945 A * | 12/1998 | Nam et al. | 375/341 |
| 6,697,442 B1 * | 2/2004 | Todoroki | 375/341 |
| 7,035,356 B1 * | 4/2006 | Langhammer | 375/341 |
| 7,359,464 B2 * | 4/2008 | Cohen | 375/341 |

\* cited by examiner

*Primary Examiner*—Shelly A Chase
(74) *Attorney, Agent, or Firm*—John J. King; Thomas George (57) ABSTRACT

A method of accessing a memory of a trellis decoder. The method comprises the steps of writing a first block of data associated with a trellis function to a first memory block; writing a second block of data associated with the trellis function to a second memory block; simultaneously writing a third block of data to a third memory block and reading the second block of data from the second memory block to generate training data; and simultaneously reading data to be decoded from the first memory block and writing a fourth block of data to the first memory block and generating training data associated with the third block of data. A circuit for accessing a memory of a trellis decoder is also described.

20 Claims, 5 Drawing Sheets

METHOD OF AND CIRCUIT FOR ACCESSING A MEMORY OF A TRELLIS DECODER

FIELD OF THE INVENTION

The present invention relates generally to decoder circuits, and in particular, to a method of and circuit for accessing a memory of a trellis decoder.

BACKGROUND OF THE INVENTION

As communication technology continues to advance, applications for the electronic communication of data continue to increase. However, the need for reliable data communication is also increasing. In certain communication applications, data is often exposed to interference, increasing the likelihood of communication errors. For example, data transmitted by way of a wireless communication network is often exposed to various forms of channel noise on the communication channel which may affect the data. Alternatively, obstacles such as buildings or natural obstructions may impede the path of data transmission, leading to burst errors which may affect larger blocks of data. Accordingly, error correction techniques are used to ensure that any errors in the transmission of data are reduced to an acceptable level for a given application.

Figure 1:
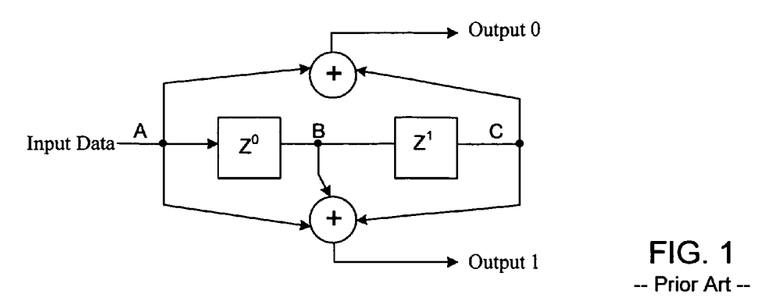
FIG. 1 is a diagram of a conventional encoder circuit.

Forward error correction (FEC) is a system of error control for data transmission often used in telecommunications applications. Convolutional coding is a type of FEC code in which each m-bit information symbol to be encoded is transformed into an n-bit symbol, where n is greater than or equal to m and m/n is the code rate. An example of a simple convolutional coding circuit is shown in FIG. 1. In particular, an input data A is input to a transform function $Z^0$ to generate a value B. A second transform function $Z^1$ receives the value B to generate a value C. A and C are added to generate an output 0, while A, B and C are added to generate an output 1. Accordingly, the circuit of FIG. 1 provides a half rate code where two bits are output for each input bit.

Data encoded using convolutional encoding is generally decoded with a trellis decoder, such as a Viterbi decoder. A trellis decoder operates by constructing a trellis of state probabilities and branch metrics. The transmitted data is often terminated with a number of zeros to force the encoder back to the zero state, allowing the decoder to start decoding from a known state. The transformation is a function of the last k information symbols, where k is the constraint length of the code and determines the length of a shift register. While FEC codes tend to require greater bandwidth than other error-correcting codes, FEC codes are more appropriate for correcting errors "on the fly" as data comes in.

In a system using trellis decoding, the results generated after a computational latency in a forward direction are then read in a reverse order in order to find the maximal likelihood path through the trellis. The decoding process consists of a branch metric block which provides cost information for the data coming into the decoder, a path metric unit such as an add-compare-select (ACS) block which compares the costs on the branches of the trellis, and a traceback block which traces back through the paths generated from the path metric unit to find the optimum path through the trellis to enable decoding of the data. Prior to the traceback process, the data has been processed by the branch metric unit and the path metric unit so that the data being written to the BRAM is the optimal path for each state in the trellis.

Figure 2:
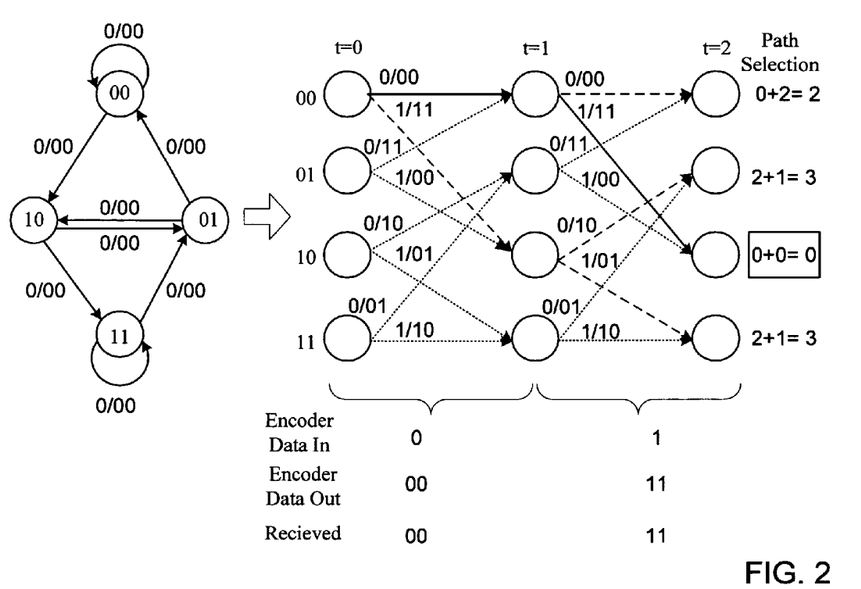
FIG. 2 is an example of a trellis diagram according to an embodiment of the present invention.

In the example of a trellis diagram of FIG. 2, the various paths from a given state to a next state are shown for a time period t=0 through t=2, where the available paths between states are defined by the encoder. The solid lines show the optimal path, the dashed lines shown the other available paths based upon a starting point of state 00, while the dotted lines show the available paths from the other states. That is, although the starting point at t=0 is state 00, the paths could extend from any of the other states at later time periods. Each state has cost value at a given time (i.e., a path metric) and each path has a given cost to each next state (i.e., a branch metric). The cost of a given path will be based upon the sum of the old path metric and the branch metric. There are always multiple paths for each state in the trellis. In the example of FIG. 2, the trellis is implanted using Radix-2. However, a trellis having more states may also be implemented. For example, a trellis could be implemented using Radix-4 having 4 paths to each state.

While there are many metrics which may be used to determine a cost from one state to another, one metric which may be used is based upon the number of bits which are different between the encoder output data and the data which is expected to be output when moving to the next state. The paths to the next state and outputs associated with the given paths are shown in the state diagram for all of the paths, where the first number before the slash mark represents the input to the encoder and the number after the slash mark represents the output of the encoder. For example, changing the bits of an output having a value 00 to a value 01 would require one bit to change, while changing the bits of an output having a value 00 to value 11 would require two bits to change. If the state of the decoder at time t=0 is 00, there are two paths from state 00 at t=0 either to state 00 or to state 10 at t=1. That is, the path to state 00 is followed if a zero has been encoded, while the path to state 10 is followed if a 1 has been encoded. At time t=1, the allowed paths from state 00 are either to state 00 if a 0 is encoded or to state 10 if a 1 has been encoded. If a 0 has been encoded and the current state is state 00, then the encoder will transmit 00 and the two input bits 00 will be received by the decoder provided the data has not been corrupted in the transmission. Similarly, if a 1 has been encoded and the current state is state 00, then the encoder will transmit 11 and 11 will be received by the decoder provided the data has not been corrupted in the transmission. To generate the branch metrics, the input data from the channel is compared with the expected input data should the trellis have taken the given path. Thus, in FIG. 2, if the current state is state 00 and we receive the input data 00, the cost of path 0. (using the simple Hamming distance metric) would be 0 as the expected data for the path is 00. The cost of path 1 is 2 because the expected data for this path is 11 which differ in both bits from the incoming data 00. While the Hamming distance is described to merely explain generating a cost for a path, a Euclidean distance metric is more commonly used.

A path selection for the various paths is selected according to the sum of a cost associated with a given state at a given time and a cost for taking a given path to the next state. A path selection cost associated with each state at a time t=2 is shown next to the state. For example, there is no cost for the path from state 00 at t=0 to state 00 at t=1. That is, the digits of the output 00 are the same as the expected output when moving from state 00 to state 00, and therefore no digits are different. Similarly, there is no cost for the path from state 00 at t=1 to state 10 at t=2. That is, there are no different bits in the encoder output which is 11 compared to the path output. Accordingly, the path shown in solid lines is the least cost path.

There are also costs which are greater than the least cost path for both available branches shown in dashed lines. In particular, the cost of the path from state 00 to state 00 at time t=2 is 2 because both bits of 00 expected to be received at state 00 are different from the output 11 of the encoder. Similarly, the cost of the path from state 10 to state 01 at time t=2 is 1 because one bit of the output 11 is different from the expected output 10. Accordingly, the total cost of the path is equal to 3. Finally, the cost of the available path from state 01 to state 11 is also equal to 2, while the total cost of the path is equal to 3. The chosen path from the ACS unit is saved in the traceback block for each state. That is, either a 1 or a 0 stored to select the path between states at each time period. In a standard Viterbi decoder having a constraint length of 7, there are 64 bits which are written to the traceback memory on each clock cycle to represent the paths between states. The traceback length is the number of time steps required to be traced back to find the correct path.

When a circuit having a given function is implemented in an integrated circuit, it is important to provide the most efficient use of circuit resources. Conventional circuits implementing a trellis decoder provide an inefficient use of resources of the integrated circuit. The efficient use of resources of an integrated circuit may be particularly significant in cases when resources are scarce. For example, the efficient use of logic resources and memory elements in a programmable logic device will enable more circuits to be implemented on a single programmable logic device. As will be described in more detail below, the requirement for additional memory blocks to implement the trellis decoder of a conventional device is inefficient, and particularly inefficient in a programmable logic device where the use of memory resources needs to be optimized.

Accordingly, there is a need for an improved method of and circuit for accessing a memory of a trellis decoder.

SUMMARY OF THE INVENTION

A method of accessing a memory of a trellis decoder is disclosed. The method comprises writing a first block of data associated with a trellis function to a first memory block; writing a second block of data associated with the trellis function to a second memory block; simultaneously writing a third block of data to a third memory block and reading the second block of data from the second memory block to generate training data; and simultaneously reading data to be decoded from the first memory block and writing a fourth block of data to the first memory block. Simultaneously reading data to be decoded from the first memory block and writing a fourth block of data to the first memory block further may comprise simultaneously reading the third block of data from the third memory block to generate training data. Writing the first, second and third blocks of data comprise writing data from a path metric unit to a memory in a first direction, wherein writing a fourth block of data may comprise writing data to the memory in a second direction opposite the first direction. Simultaneously reading data to be decoded from the first memory block and writing a fourth block of data to the first memory block comprises employing a read before write feature of the memory. The method may further comprise reading the fourth block of data from the first memory block to generate training data, wherein reading training data associated with the fourth block of data from the first memory block comprises reading data in the second direction.

According to an alternate embodiment, a method of accessing a memory of a trellis decoder comprises writing a first block of data associated with a trellis function to a first memory block during a first memory access cycle; writing a second block of data associated with the trellis function to a second memory block during a second memory access cycle; simultaneously writing a third block of data to a third memory block and reading the second block of data from the second memory block during a third memory access cycle to generate training data; and simultaneously reading data to be decoded from the first memory block and writing a fourth block of data to the first memory block in a single memory access cycle using a first port of a dual port random access memory and reading the third block of data to generate training data during a fourth memory access cycle. The method may further comprise toggling the direction of write addressing after every third block of data written to a memory block.

A circuit for accessing a memory of a trellis decoder is also described. The circuit comprises a first address generator coupled to receive a direction signal and output a first address; and a dual port random access memory coupled to receive data at a data input port and an address from the first address generator at a first address port, wherein the first address generator outputs a first range of addresses in a first direction for data stored in a first block of memory associated with the first address port and a second range of addresses in a second direction for a second block of data stored in the first block of memory. The first address generator may further receive a first offset signal for generating the second range of addresses in the second direction. The circuit may further comprise a second address generator coupled to a second address port of the dual port random access memory, wherein the second address generator outputs a third range of addresses in the second direction for reading data to be decoded for generating training data. The second address generator may further receive a second offset signal for generating the third range of addresses in the second direction.

DETAILED DESCRIPTION OF THE DRAWINGS

Figure 3:
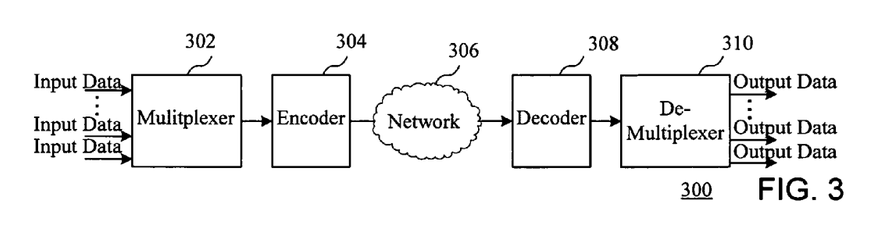
FIG. 3 is a block diagram of system for encoding and decoding data according to an embodiment of the present invention.

Turning first to FIG. 3, a block diagram of a system for encoding and decoding data according to an embodiment of the present invention is shown. A multiplexer 302 receives input data streams, and couples a selected input data stream to an encoder 304. The encoder 304 could be, for example, a convolutional encoder as described generally above in reference to FIG. 1. The output of the encoder is coupled to a network 306, which may be any type of communication network, such as including wireless or wired communication network. A decoder 308 receives the encoded data by way of the network, and provides decoded data to a demultiplexer 310 to generate an output data stream. Although the network for transmitting data in FIG. 3 is shown by way of example, the decoder described in more detail below may be employed in any type of network. Further, the network may comprise additional elements. For example, an interleaver may be provided before the encoder and a corresponding de-interleaver after the decoder to help reduce burst errors.

Figure 4:
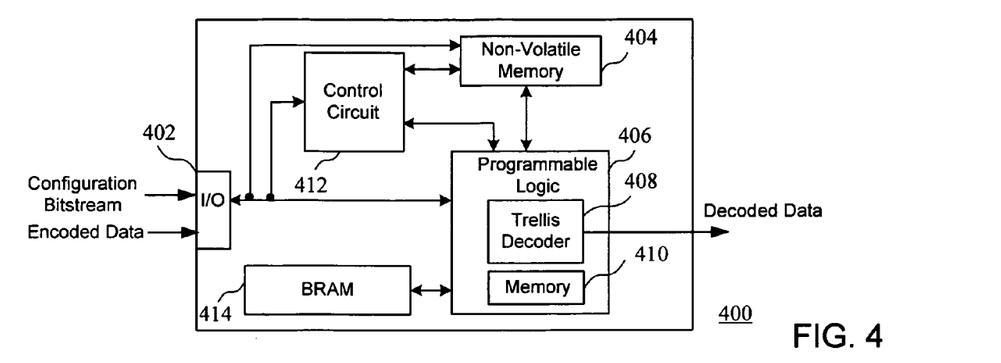
FIG. 4 is a block diagram of a circuit having a trellis decoder for decoding data according to an embodiment of the present invention.

Turning now to FIG. 4, a block diagram of a circuit for decoding data according to an embodiment of the present invention is shown. In particular, a system 400 comprises an input/output (I/O) port 402 which is coupled to receive encoded data which is to be decoded as described in more detail below. If the circuit 400 comprises programmable logic, a configuration bitstream may also be received at the I/O port. The encoded data and the configuration bitstream may be directly coupled to a non-volatile memory 404, enabling programming of a programmable logic 406. The programmable logic may comprise trellis decoder 408. The programmable logic may also comprise a memory 410. As will be described in more detail in reference to the programmable logic device of FIG. 10, the memory 410 may comprise blocks of Random Access Memory (BRAMs) or distributed memory associated with a configurable logic block. Alternatively, the bitstream may be provided directly to the programmable logic 406 or may be coupled to a control circuit 412. A BRAM 414 associated with the trellis decoder may be separate from the programmable logic. The operation of the trellis decoder will be described in more detail below in reference to FIGS. 5-12. The system 400 may be an integrated circuit having both a control circuit and a non-volatile memory for programming programmable logic. For example, the system 400 may be a programmable logic device, or an application specific integrated circuit (ASIC) having programmable logic. Alternatively, the system 400 may be a circuit board having a plurality of integrated circuits including a control circuit, a non-volatile memory and a programmable logic device.

Figure 5:
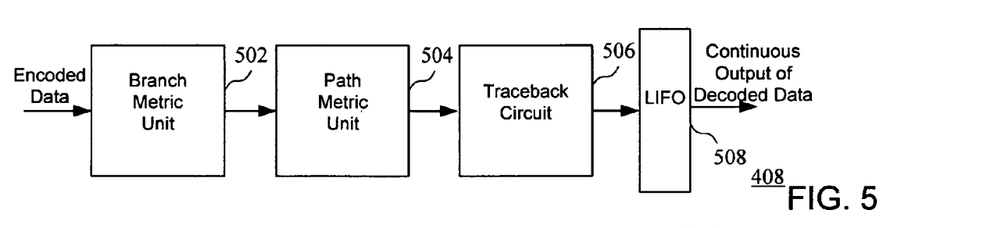
FIG. 5 is a block diagram of a trellis decoder according to an embodiment of the present invention.

Turning now to FIG. 5, a block diagram of a trellis decoder according to an embodiment of the present invention is shown. In particular, encoded data is received by a branch metric unit 502. The branch metric unit generates costs, known as branch metrics, for the received data from a demodulator for each of the possible outputs of the encoder. The costs of a given branch may be determined using the Euclidean method, for example. The output of the branch metric unit is coupled to a path metric unit 504 which determines the best path from a current state to a next state. An example of a path metric unit is shown by way of example as an add-compare-select (ACS) circuit which will be described in more detail in reference to FIG. 6. Finally, a traceback circuit is employed to store data to decode the encoded data. The traceback circuit 506 will be described in more detail in reference to FIG. 7. Finally, a last in, first out (LIFO) circuit 508 is used to reverse the order of the output data. That is, because the data is output in the reverse order during traceback, a LIFO may be used to output the data in the correct order. The LIFO may be eliminated according to an embodiment of the invention, as will be described in more detail in reference to FIG. 10.

Figure 6:
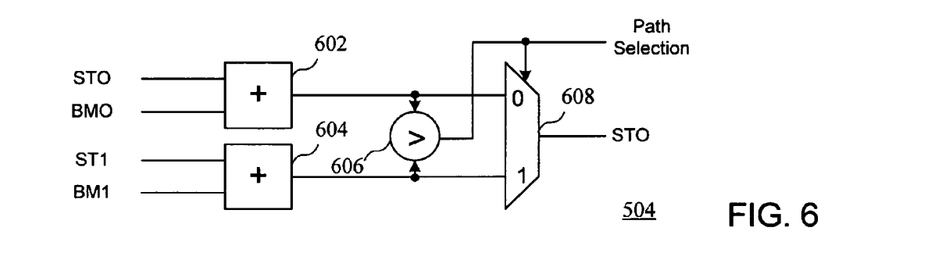
FIG. 6 is a path metric unit 504 of the trellis decoder of FIG. 5 according to an embodiment of the present invention.

Turning now to FIG. 6, a path metric unit 504 of FIG. 5 is shown. In particular, a first summing circuit 602 receives a state 0 (ST0) value and a branch metric value for branch 0 (BM0). That is, the summing circuit 602 will add the cost of a branch and cost of a next path to determine the cost of each input to determine the next path. A second summing circuit 604 is coupled to receive a state 1 (ST1) value and a branch metric value for branch 1 (BM1). A comparator 606 is coupled to receive the outputs of the summing circuits, and determine which path has a lower cost. The path selection output of the comparator circuit is coupled to a multiplexer 608 to select one of the two paths. The selection of a path and the decoding of data will be described in more detail in reference to FIGS. 7-10. Although a single path metric unit is shown, a separate path metric unit can be used to determine a path for each state.

Figure 7:
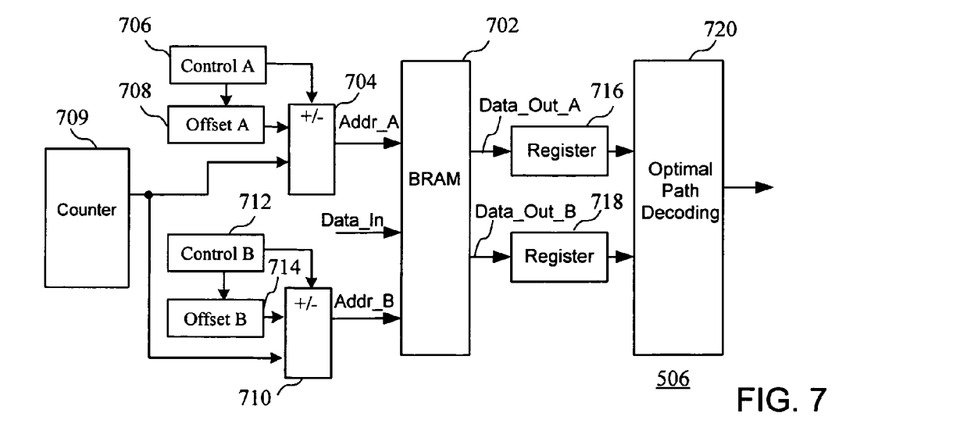
FIG. 7 is a block diagram of the traceback circuit 506 of the trellis decoder of FIG. 5 according to an embodiment of the present invention.

Turning now to FIG. 7, a block diagram of a traceback circuit 506 of FIG. 5 according to an embodiment of the present invention is shown. In particular, a dual port BRAM 702 is coupled to receive the output Addr_A of a first address generator 704 which receives a direction control signal from a control circuit A 706 and an offset from an offset circuit A 708. The address generator 704 also receives a count from a counter 709 to set the amount of data to be written in a write cycle, training data to be decoded or data to be decoded, as will be described in detail below. The counter will count from zero to the traceback length minus one so that the number of writing and reading cycles are equal to the traceback length. The BRAM 702 also receives data Data_In from the output of the path metric unit to write the data to register A. The BRAM 702 is coupled to receive the output Addr B of a second address generator 710 which receives a direction control signal from a control circuit A 712 and an offset from an offset circuit B 714. The address generator 710 also receives the count from the counter 709.

When finding the optimal path through the trellis when decoding data, a training sequence extending the traceback length is decoded before the data is decoded for a previous block of data. The length of the training sequence is preferably greater than a fixed multiple of the constraint length of the decoder in order for the data to be correctly decoded and minimize errors in the output sequence. For a Viterbi decoder of constraint length 7 used in the IEEE Standard 802.16 and the GSM standard for cellular telephones, the data width of each block is 64. For a Viterbi decoder having a constraint length 9 used in third generation (3G) standards for cellular telephones, the data width is 256 bits. The traceback length is normally about 96. That is, 96 training points are read and decoded in reverse order to determine the path through the trellis of a current block, and then the 96 data points of the previous data block are decoded. That is, after the training sequence is decoded, the block prior to the training sequence is decoded and output after a final reversal block as the decoded data from the Viterbi. In other embodiments, other traceback lengths are used.

In order to decode the convolutionally encoded data as a continuous output stream, careful memory management is required in the traceback block. As will be described in more detail in reference to FIG. 9, the dual port BRAM 702 is used to generate a block of data to be decoded from the path metric unit to a first register 716. Training data used to decode the data in the first register is generated based upon data stored in a second register 718. Training data is decoded to provide a starting state for the traceback decoding of the previous block of data. The optimal path decoding circuit 720 will determine the optimal path by tracing back through the trellis using a starting point determined by decoding the training data, as is well known in the art. The optimal path decoding circuit 720 is used to generate training data and decoded data, as will be described in more detail in reference to FIG. 9. Unlike conventional circuits which require double buffering during the traceback decoding, the circuit of FIG. 7 eliminates the need for double buffering, and therefore the additional logic required to control the read/write for those two buffers.

Figure 8:
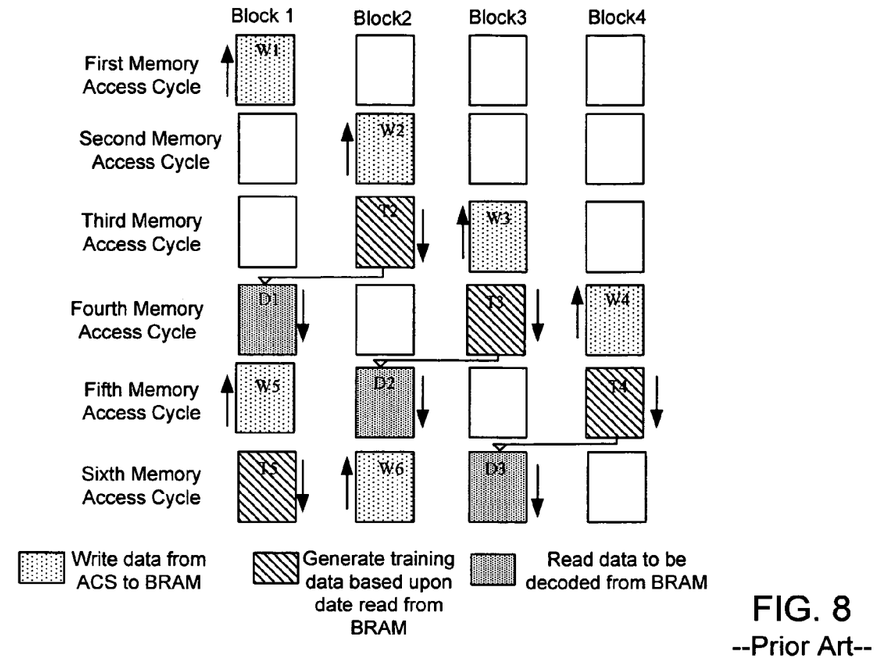
FIG. 8 is an example of timing diagram showing the steps of accessing a memory associated with a trellis decoder according to a conventional method.

Turning now to FIG. 8, an example of a timing diagram shows the steps of accessing a memory associated with a trellis decoder according to a conventional method. Conventional traceback decoding uses a ping-pong memory structure in order to achieve the continuous streaming of the output data. In a typical memory access structure, three memory accesses are required during each memory access cycle after the third memory access cycle. The write address is used to continuously write data from the path metric unit module into the lightly shaded blocks with an incrementing (or decrementing) address. The training block read address is a decrementing (or incrementing) address. As described above, data that has been written from the path metric unit in a trellis decoder is read in reverse order to determine the optimal maximum likelihood path prior to actually decoding the data. The decoding address is the same decrementing (or incrementing) address as the training address but is accessing a different block of the traceback memory. The six memory access cycles for writing and decoding three blocks of data according to a conventional method will be described.

In the example of a conventional circuit, a first block of data W1 is written from the path metric unit to a first memory block during a first memory access cycle. The data is written in a first direction, where the upward arrow indicates that the data is written from address 0 to 95 (i.e., from 0 to the traceback length minus one, where the traceback length is 96), for example. A second block of data W2 from the path metric unit to a second memory block during a second memory access cycle. The second block of data is also written in the first direction from address 96 to address 191, for example. During a third memory access cycle, training data T2 is generated based upon the second block of data read from the second memory block in a second direction opposite the first direction, while a third block of data W3 is written to a third memory block from address 192 to address 287 in the first direction. The training data is generated based upon data read in the second direction because it comprises decoded data based upon decoding in a reverse direction as required in a trellis decoder.

The first block of data W1 is then decoded using the training data T2, and read from the first memory block to generate decoded data D1 during a fourth memory access cycle. During the same memory access cycle, training data T3 is generated based upon the third block of data W3 read from the third memory block in the second direction, while a fourth block of data W4 is written to a fourth memory block for address 288 to address 383 in the first direction. The second block of data W2 is decoded using the training data T3, and read from the second memory block to generate decoded data D2 during a fifth memory access cycle. Training data T4 is generated based upon the fourth block of data W4 read from the fourth memory block in the second direction, while a fifth block of data W5 is written to a first memory block in the first direction during the fifth memory access cycle. Finally, during a sixth memory access cycle, the third block of data W3 is decoded using the training data T4, and read from the third memory block to generate decoded data D3. Also during the sixth memory access cycle, training data T5 is generated based upon the fifth block of data W5 read from the first memory block in the second direction, while a sixth block of data W6 is written to a second memory block in the first direction.

Accordingly, as can be seen, four memory blocks each having a depth equal to the traceback length are required in a conventional circuit implementing a trellis decoder. For a traceback length of 96, 384 memory locations are required. Two dual port BRAMs are also required, where two blocks of the first dual port RAM may be used to implement blocks 1 and 2 and two blocks of the second dual port RAM may be used to implement blocks 3 and 4. On a field programmable gate array (FPGA) with 18 Kilobit BRAMs, a conventional circuit implemented according to the implementation of FIG. 7 requires 4 BRAMs for a decoder having a constraint length of 7 and 16 BRAMs for a decoder having a constraint length of 9. For multi-channel decoders where many interlaced channels are decoded simultaneously, the BRAM requirement is even greater as the depth of block 1 and block 2 will exceed the depth of 512, if the maximum width of the BRAM is 36 bits wide.

Figure 9:
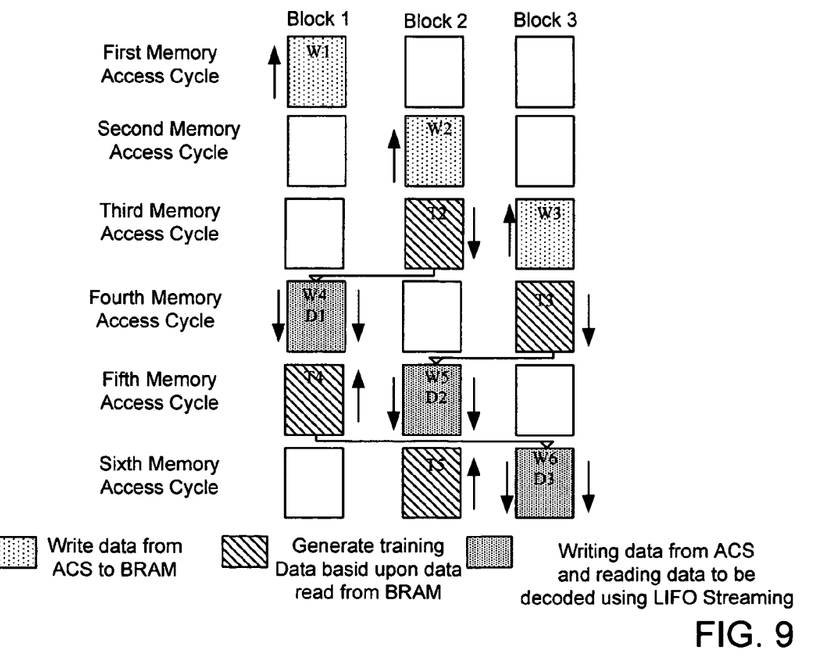
FIG. 9 is a timing diagram showing steps of accessing a memory associated with a trellis decoder according to an embodiment of the present invention.

However, by employing the circuit of FIG. 7, the requirement for ping-pong addressing is removed, significantly reducing the requirement for dual port BRAMs in a single channel Viterbi decoder by one half. For a multi-channel Viterbi decoder, the BRAM savings are even more significant and depend on the number of channels to be decoded. The timing diagram of FIG. 9 shows the steps of accessing a memory associated with a trellis decoder using the circuit of FIG. 7. In particular, a first block of data from the path metric unit is written to a first memory block during a first memory access cycle. A second block of data W2 from the path metric unit is written to a second memory block during a second memory access cycle. During a third memory access cycle, training data is generated based upon data read in a second direction opposite the first direction from the second memory block, while a third block of data W3 is written to a third memory block in the first direction.

During a fourth memory access cycle, decoded data D1 associated with the first block of data W1 is generated based upon data read from the first memory block in a second direction, while a fourth block of data W4 is simultaneously written to the same memory locations of the first memory block. The simultaneous reading and writing may be accomplished by using a read before write function of a BRAM. That is, the memory location is simultaneously accessed where data is read from the location before new data is written to the location during a single memory access. In contrast with a conventional circuit implemented according to FIG. 8 where data is always written to the blocks of memory in the same direction, the block of data W4 written to the first block of memory is written in the opposite direction compared to the previous three blocks. Training data is also generated based upon data read from a third block of data in the second direction during the third memory access cycle. As can be seen, although there are still three memory accesses, only two memory blocks are required to be accessed during the third memory access cycle. Similarly, during a fifth memory access cycle, decoded data D2 associated with the second block of data W2 is generated based upon data read from the second memory block in the second direction, while a fifth block of data W5 is simultaneously written in the second direction to the same memory locations of the second memory block. Training data is also generated based upon data read from the first block of data during the fifth memory access cycle. Finally, during a sixth memory access cycle, decoded data D3 associated with the third block of data W3 is generated based upon data read from the third memory block in the second direction, while a sixth block of data W6 is simultaneously written in the second direction to the same memory locations of the third memory block. Training data is also generated based upon data read from a second block of data during the sixth memory access cycle in the opposite direction to which the data was written.

Accordingly, the circuit of FIG. 7 implemented according to the memory access cycles of FIG. 8 reduces the required number of read and write accesses, and thus allows users to reduce the dual port BRAM requirement for the Viterbi decoder by one half. Because the traceback memory structure of FIG. 7 requires only two addresses for accessing the data, the circuit may be implemented in a single dual port BRAM. Further, the number of memory locations is reduced by one fourth by reducing the number of blocks having a number of memory locations equal to the traceback length from 4 memory blocks to 3 memory blocks. The first block of data is written at the address defined by an address generated in a first direction. The next two blocks are written to the address defined by the same address generator offset by multiples of a given offset, such as 96. The next three blocks of data are written to the address defined by a count in a second direction, where the count is again offset with the required offset. By reversing the direction of writing the data to be decoded every three blocks and utilizing the read before write property of a RAM, the data to be decoded is always read out in the reverse order to that in which it was originally written. The training data is also generated by data read from a separate block and again requires the reversal of addressing every three blocks so that the training data is based upon data read from the block of memory in the reverse order compared to the order the data to be decoded was written to the block of memory.

Figure 10:
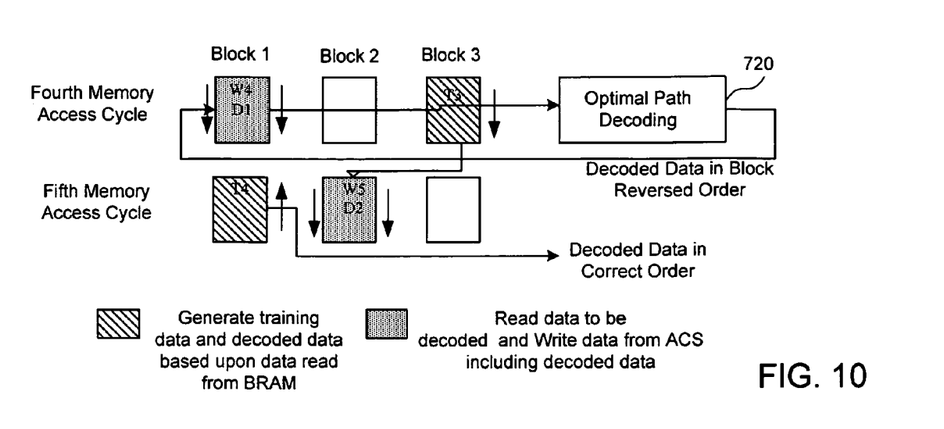
FIG. 10 is a timing diagram showing steps of accessing a memory associated with a trellis decoder according to an alternate embodiment of the present invention.

Turning now to FIG. 10, a timing diagram shows steps of accessing a memory associated with a trellis decoder according to an alternate embodiment of the present invention. According to the embodiment of FIG. 10, the LIFO circuit at the output of the traceback circuit is eliminated by decoding the data as it is read from the memory block, and simultaneously storing the decoded data with the data written to the memory block. The output from the decoding block for a Viterbi decoder is decoded data, but the data is in reverse order and requires to be reversed in a LIFO on a block by block basis. In order to avoid the extra logic or RAM required to reverse the data prior to output, the BRAM is used to reverse the data by storing the data with the data which is written to the BRAM in reverse order. That is, the data is read from the BRAM to be decoded in the decoding block, such as the optimal path decoding circuit 720, and the output from the decoding block is combined with the incoming data from the path metric unit and written to the BRAM. Thus, the width of the data written to the RAM for each block write is the number of states plus 1, where the decoded data may occupy the most significant bit of the written data. The decoded data is then read out in the correct order when the training data is read in the next set of block reads. As the data read out of the memory to generate training data is always read in the reverse order to which the data was written, the decoded data has now been reversed on a block basis. The extra bit on the write data usually has no extra penalty in terms of BRAM requirements because most BRAM widths are defined with extra bits for parity data and in general are multiples of 9 bits wide. For a decoder having a constraint length of 7, 64 bits are required for the path metric unit data and 1 bit is required for the data from the decoding block, resulting in a data width for the write and read data of 65 bits. Although there may be an offset of a certain number of bits in order to account for the time required to decode the data, the offset can be accounted for and the trailing data bits may be stored in a separate register.

Figure 11:
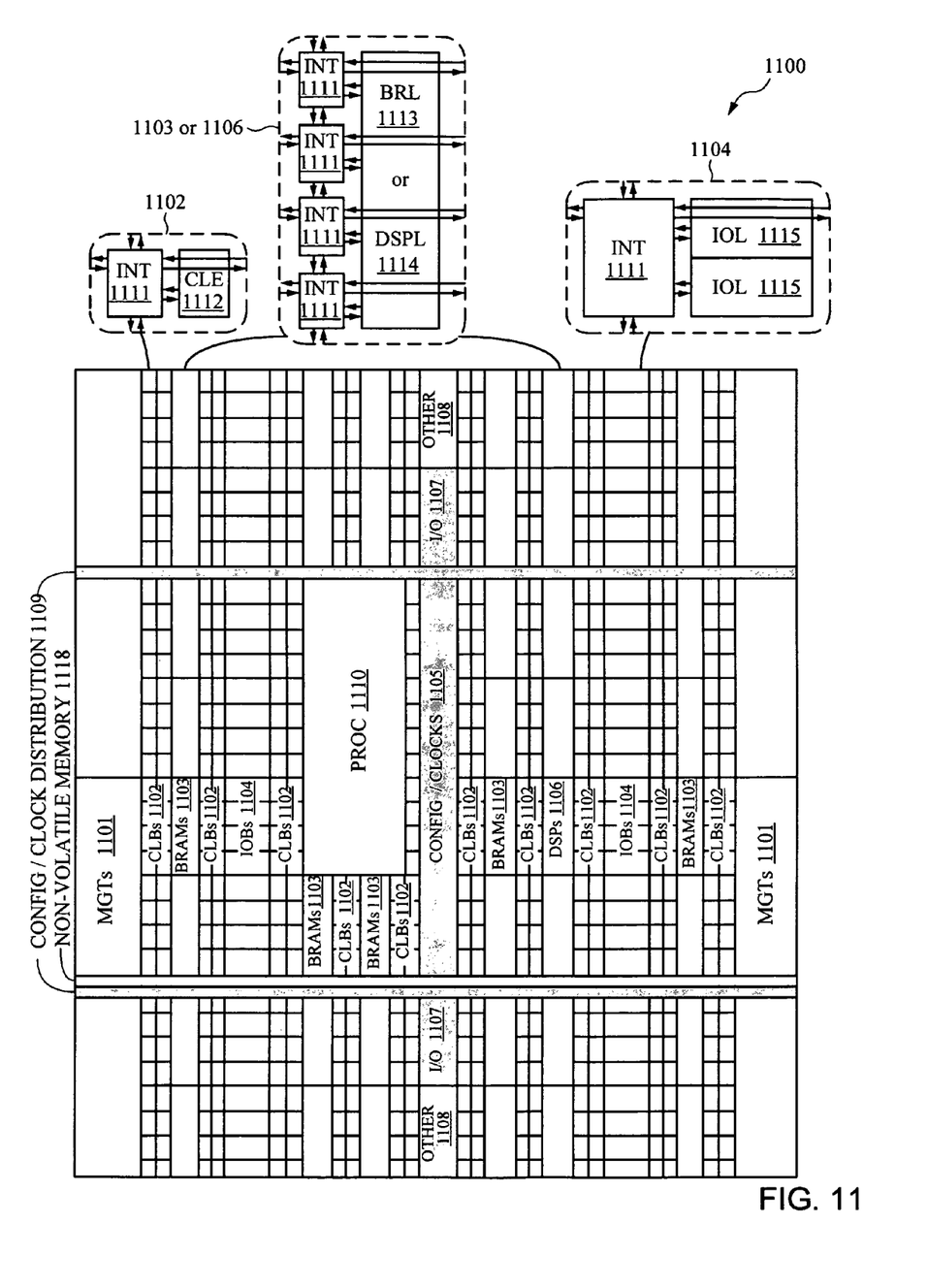
FIG. 11 is a block diagram of a programmable logic device implementing a trellis decoder according to an embodiment of the present invention.

Turning now to FIG. 11, a block diagram of a programmable logic device that can be used to implement a trellis decoder according to an embodiment of the present invention is shown. A programmable logic device is a type of integrated circuit that is designed to be user-programmable so that users may implement logic designs of their choices. One type of programmable logic device is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources.

The exemplary FPGA architecture 1100 of FIG. 11 includes a large number of different programmable tiles including multi-gigabit transceivers (MGTs 1101), configurable logic blocks (CLBs 1102), random access memory blocks (BRAMs 1103), input/output blocks (IOBs 1104), configuration and clocking logic (CONFIG/CLOCKS 1105), digital signal processing blocks (DSPs 1106), specialized input/output blocks (I/O 1107) (e.g., configuration ports and clock ports), and other programmable logic 1108 such as digital clock managers, analog-to-digital converters, system monitoring logic, and so forth. Some FPGAs also include dedicated processor blocks (PROC 1110).

In some FPGAs, each programmable tile includes a programmable interconnect element (INT 1111) having standardized connections to and from a corresponding interconnect element in each adjacent tile. Therefore, the programmable interconnect elements taken together implement the programmable interconnect structure for the illustrated FPGA. The programmable interconnect element (INT 1111) also includes the connections to and from the programmable logic element within the same tile, as shown by the examples included at the top of FIG. 11.

For example, a CLB 1102 may include a configurable logic element (CLE 1112) that may be programmed to implement user logic plus a single programmable interconnect element (INT 1111). A BRAM 1103 may include a BRAM logic element (BRL 1113) in addition to one or more programmable interconnect elements. The BRAM comprises dedicated memory separate from the distributed RAM of a configuration logic block. The BRAM 1102 may be implemented in one of the BRAMs, for example. The remaining portions of the circuit may be implemented in configurable logic elements of a CLB. Typically, the number of interconnect elements included in a tile depends on the height of the tile. In the pictured embodiment, a BRAM tile has the same height as four CLBs, but other numbers (e.g., five) may also be used. A DSP tile 1106 may include a DSP logic element (DSPL 1114) in addition to an appropriate number of programmable interconnect elements. An IOB 1104 may include, for example, two instances of an input/output logic element (IOL 1115) in addition to one instance of the programmable interconnect element (INT 1111). As will be clear to those of skill in the art, the actual I/O pads connected, for example, to the I/O logic element 1115 are manufactured using metal layered above the various illustrated logic blocks, and typically are not confined to the area of the input/output logic element 1115.

In the pictured embodiment, a columnar area near the center of the die (shown shaded in FIG. 11) is used for configuration, clock, and other control logic. Horizontal areas 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs. Finally, a non-volatile memory 1118 may be employed for on-chip storage of configuration data which is used to configure the configuration logic blocks or other programmable tiles as described above.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear, to facilitate the efficient implementation of user logic. While an FPGA is shown in detail as one type of programmable logic device by way of example, the circuits and methods of the present invention may be implemented in any device, including any type of integrated circuit having programmable logic.

Figure 12:
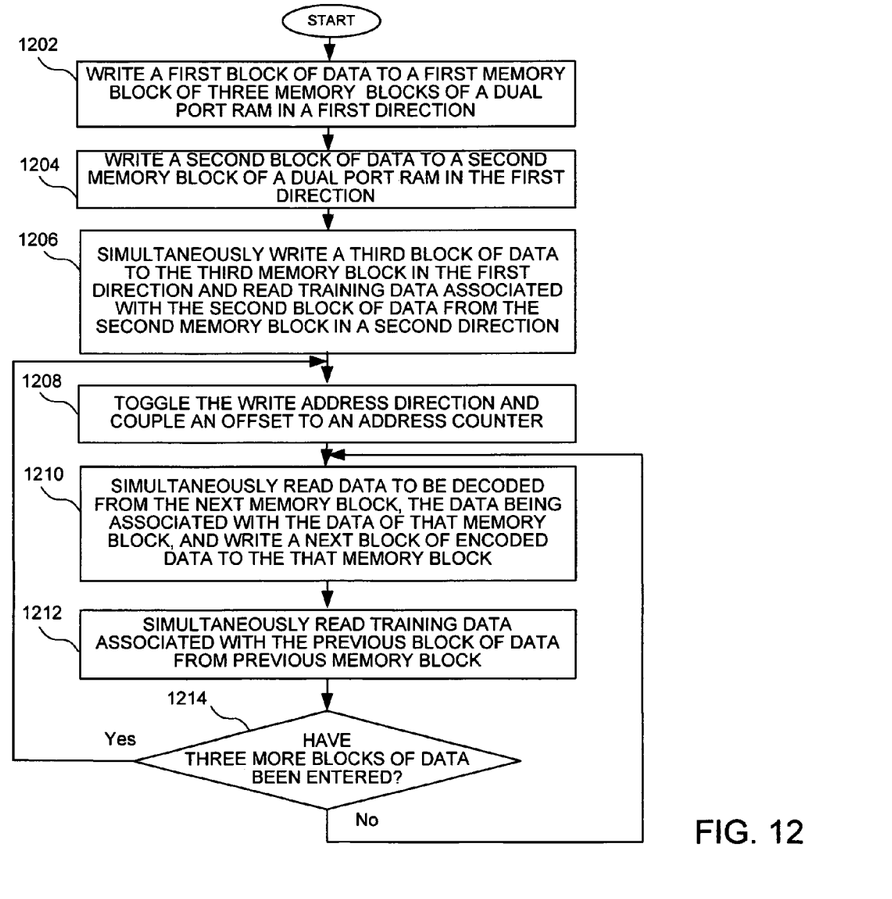
FIG. 12 is a flow chart showing a method of accessing a memory of a trellis decoder according to an embodiment the present invention.

Finally, turning to FIG. 12, a flow chart shows a method of accessing a memory of a trellis decoder according to an embodiment the present invention. While the method of FIG. 12 may be implemented using any of the circuit of figures as described above, or some other suitable circuit, the method may be implemented using the circuit of FIG. 7 according to the implementation of FIG. 9. A first block of data is written to a first memory block of three memory blocks of a dual port RAM at a step 1202. A second block of data is written to a second memory block of a dual port RAM at a step 1204. A third block of data is written to the third memory block and reading training data associated with the second block of data is generated based upon data simultaneously read from the second memory block in the second direction at a step 1206. The write address direction toggled and an offset is coupled to an address generator at a step 1208. Data to be decoded is read from the next memory block and a next block of data is simultaneously written to that memory block at a step 1210. Training data associated with a block of data to be decoded next is also generated based upon data simultaneously read from the previous memory block in a direction opposite to that in which it was written at a step 1212. It is then determined whether three more blocks of data been written at a step 1214. If three blocks of data have not been written, another block of data is written at step 1210. If three blocks of data have been written, the write address direction is toggled at step 1208.

It can therefore be appreciated that the new and novel method of and circuit for accessing a memory of a trellis decoder has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of accessing a memory of a trellis decoder, the method comprising:
   writing a first block of data associated with a trellis function to a first memory block;
   writing a second block of data associated with the trellis function to a second memory block;
   simultaneously writing a third block of data to a third memory block and reading the second block of data from the second memory block to generate training data; and
   simultaneously reading data to be decoded from the first memory block and writing a fourth block of data to the first memory block.

2. The method of claim 1, wherein simultaneously reading data to be decoded from the first memory block and writing a fourth block of data to the first memory block further comprises simultaneously reading the third block of data from the third memory block to generate training data.

3. The method of claim 1, wherein writing the first, second and third blocks of data comprise writing data from a path metric unit to a memory in a first direction.

4. The method of claim 3, wherein writing a fourth block of data comprises writing data to a memory block in a second direction opposite from the first direction.

5. The method of claim 1, wherein simultaneously reading data to be decoded from the first memory block and writing a fourth block of data to the first memory block comprises employing a read before write feature of a memory.

6. The method of claim 1, further comprising reading the fourth block of data from the first memory block to generate training data.

7. The method of claim 6, wherein reading the fourth block of data from the first memory block comprises generating training data based upon the fourth block of data read in the second direction.

8. The method of claim 7, further comprising simultaneously reading data to be decoded associated with the second block of data from the second memory block and writing a fifth block of data to the second memory block while reading the fourth block of data from the first memory block to generate training data.

9. The method of claim 8, further comprising reading the fifth block of data from the second memory block to generate training data.

10. The method of claim 9, further comprising simultaneously reading data to be decoded associated with the third block of data from the third memory block and writing a sixth block of data to the third memory block while reading the fifth block of data from the second memory block.

11. A method of accessing a memory of a trellis decoder, the method comprising the steps of:
   writing a first block of data associated with a trellis function to a first memory block during a first memory access cycle;
   writing a second block of data associated with the trellis function to a second memory block during a second memory access cycle;
   simultaneously writing a third block of data to a third memory block and reading the second block of data from the second memory block during a third memory access cycle to generate training data; and
   simultaneously reading data to be decoded from the first memory block and writing a fourth block of data to the first memory block in a single memory access cycle using a first port of a dual port random access memory and reading the third block of data to generate training data during a fourth memory access cycle.

12. The method of claim 11, wherein simultaneously reading data to be decoded from the first memory block and writing a fourth block of data to the first memory block in a single memory access cycle using a first port of a dual port random access memory comprises performing a read before write memory access of the first memory block.

13. The method of claim 11, further comprising toggling a direction of write addressing after every third block of data written to a memory block.

14. The method of claim 13, wherein reading data to be decoded from the first memory block comprises reading out data in the opposite direction to that which it was written.

15. The method of claim 11, wherein reading the second block of data from the second memory block during a third memory access cycle comprises reading the second block of data in an opposite direction from which the second block of data was written to generate training data.

16. A circuit for accessing a memory of a trellis decoder, comprising:
   a first address generator coupled to receive a direction signal and output a first address; and
   a dual port random access memory coupled to receive data at a data input port and to receive the first address at a first address port,
   wherein the first address generator outputs a first range of addresses in a first direction for data stored in a first block of memory associated with the first address port and a second range of addresses in a second direction for a second block of data stored in the first block of memory, wherein the first direction is opposite to the second direction.

17. The circuit of claim 16, wherein the first address generator further receives a first offset signal for generating the second range of addresses in the second direction.

18. The circuit of claim 16, further comprising a second address generator coupled to a second address port of the dual port random access memory, wherein the second address generator outputs a third range of addresses in the second direction for reading data to be decoded for generating training data.

19. The circuit of claim 18, wherein the second address generator further receives a second offset signal for generating the third range of addresses in the second direction.

20. The circuit of claim 16, wherein the first direction is a forward direction with addresses in the first range of addresses increasing, and the second direction is an opposite direction with addresses in the second range of addresses decreasing.

* * * * *